United States Patent [19]

Curtis et al.

[11] Patent Number: 5,602,711
[45] Date of Patent: Feb. 11, 1997

[54] APPARATUS FOR MONITORING INDUCTANCE

[75] Inventors: John F. Curtis, Brighton; Bhalchandra V. Jayawant, Kingston near Lewes; Raymond J. Whorlow, Brighton, all of United Kingdom

[73] Assignee: British Nuclear Fuels plc, Warrington, United Kingdom

[21] Appl. No.: 347,066

[22] Filed: Nov. 23, 1994

Related U.S. Application Data

[63] Continuation of Ser. No. 986,733, Dec. 8, 1992, abandoned.

[30] Foreign Application Priority Data

Jan. 3, 1992 [GB] United Kingdom .................. 9200087
Oct. 20, 1992 [GB] United Kingdom .................. 9222017

[51] Int. Cl.[6] .................................................. H02N 15/00
[52] U.S. Cl. ........................... 361/139; 361/144; 361/146
[58] Field of Search ..................................... 324/654–657, 324/207.15, 207.16, 207.26; 361/139, 143, 144, 146, 154, 179, 180, 210; 310/90.5

[56] References Cited

U.S. PATENT DOCUMENTS

| | | | |
|---|---|---|---|
| 3,308,349 | 3/1967 | Kirkpatrick | 361/146 |
| 3,970,925 | 7/1976 | Proctor et al. | 324/649 |
| 4,045,728 | 8/1977 | Fletcher et al. | 324/655 |
| 4,605,983 | 8/1986 | Harvey | 361/154 |
| 4,612,596 | 9/1986 | Fox | 361/146 |
| 4,652,820 | 3/1987 | Maresca | 324/207.16 |
| 4,809,742 | 3/1989 | Grau | 137/554 |
| 4,950,985 | 8/1990 | Voss et al. | 324/207.16 |
| 5,045,786 | 9/1991 | Fischer | 324/654 X |
| 5,172,298 | 12/1992 | Shimizu et al. | 361/152 |
| 5,331,277 | 7/1994 | Burreson | 324/207.16 |
| 5,467,244 | 11/1995 | Jayawant et al. | 361/144 |

FOREIGN PATENT DOCUMENTS

| | | |
|---|---|---|
| 581246 | 10/1946 | United Kingdom . |
| 654394 | 6/1951 | United Kingdom . |
| 844360 | 8/1960 | United Kingdom . |
| 875869 | 8/1961 | United Kingdom . |

OTHER PUBLICATIONS

Murgatroyd, P. N.; "Fast Frictionless Rotation"; Electrical Review vol. 203 No. 3, 21 Jul. 1978, p. 21.

*Primary Examiner*—Fritz Fleming
*Attorney, Agent, or Firm*—Nixon & Vanderhye P.C.

[57] ABSTRACT

An apparatus for monitoring the inductance of a coil (L1) which is not part of a resonant circuit including a second coil (L2) connected in series with the first mentioned coil and a resonant circuit which is formed by connection of a capacitor (C5) to the second coil, or optionally (C2) to a third coil (L3) which is in a mutually inductive relationship with the second coil so that the second and third coils act as the primary and secondary coils of a transformer (M), a device (1) for injecting into the circuit containing the first mentioned and second coils an a.c. signal of substantially constant peak voltage amplitude having a frequency within the resonance peak of the resonant circuit, and an amplitude detector (5) for measuring the amplitude of the voltage across a component of the resonant circuit. The apparatus may be employed as so-called integral control in closed loop control of the suspension of an object by the first mentioned coil. The output of the amplitude detector in such an arrangement may be applied successively to an error detector (7) and integrator (9).

20 Claims, 4 Drawing Sheets

APPARATUS FOR MONITORING INDUCTANCE

This application is a continuation of application Ser. No. 07/986,733, filed Dec. 8, 1992, now abandoned.

RELATED APPLICATIONS

An Application of even date by Raymond John Whorlow assigned to the present Assignee claiming priority from UK Patent Application Nos 9200087.6 and 9219959.5.

RIGHTS ARISING FROM FEDERALLY SPONSORED RESEARCH

Nil.

BACKGROUND OF THE INVENTION

The present invention relates to apparatus for monitoring the inductance of a coil.

The present invention may be employed in apparatus for the electromagnetic control of the suspension of an object.

Electromagnetic control of the position of an object by suspension or levitation has been employed in a number of commercial applications in the field of industrial engineering. Such applications have included passenger-carrying vehicles, conveyor systems, flow meters, frictionless bearings, tool spindles, centrifuges, alternators, pumps, compressors and balances. One aspect of the present invention is concerned with systems for the electromagnetic control of the suspension of an object which are suitable for use in such applications and which systems are of the kind including an electromagnet comprising an inductive control coil, a source of electric power for the electromagnet which source includes a controllable electric supply device capable of delivering a controlled electric supply to the electromagnet, a control signal producer for generating an error control signal in response to an incremental change in a parameter related to the position of the object relative to the electromagnet and a negative feedback control loop for feeding an error control signal generated by the control signal producer to the electric supply device to adjust the electrical supply to the coil so as to stabilise the suspension of the object relative to the electromagnet.

The relative position of the object, ie the separation or gap between the electromagnet and the object being controlled, is monitored in the prior art by a transducer forming part of the control signal generator for the feedback loop. Such transducers have included devices which are photocells (detecting the interruption of a light beam by movement of the object); magnetic (comprising a gap flux density measurement device, eg Hall plate); inductive (employing two coils in a Maxwell bridge which is in balance when the inductance of the coils is equal); I/B detectors (in which the ratio of the electromagnet coil current and magnetic flux produced is determined to provide a measure of the gap between electromagnet and object; for small disturbances the division may be replaced by a subtraction); and capacitive (employing an oscillator circuit whose output frequency varies with suspension gap).

The use of the air gap or separation measurement transducers in prior systems has not been entirely satisfactory. Usually, the transducer has an upper temperature limit of operation. The transducers have a discrete physical size and the space occupied by the transducer reduces the space available for the electromagnet and therefore the force which can be exerted on the object.

This problem is significant where the object is a shaft which is able to bend, eg at a resonant rotation frequency in its so-called "free-free" mode, confining the positions in which the transducer may be located.

DISCUSSION OF THE RELATED ART

There are a number of published patent specifications in the prior art which describe the measurement of a reactance due to an inductance involving the use of a resonant circuit. Examples are GB 0875869, GB 0844360, GB 0654394, GB 0581246 and US 3970925. In all cases, however, the approach is to measure the reactance within a resonant circuit in which the applied frequency is variable whilst the circuit is in use so that the unknown reactance can detected by applying different frequencies to the resonant circuit.

SUMMARY OF THE INVENTION

According to the present invention an apparatus for monitoring the inductance of a first coil which is not part of a resonant circuit includes a second coil connected in series with the first coil, and a resonant circuit which is formed by connection of a capacitor to the second coil, or to a third coil which is in a mutually inductive relationship with the second coil so that the second and third coils act as the primary and secondary coils of a transformer, means for injecting into the circuit containing the first and second coils an a.c. signal of substantially constant peak voltage amplitude having a frequency within the resonance peak of the resonant circuit, and an amplitude detector for measuring the amplitude of the voltage across a component of the resonant circuit.

In the present invention the coil whose inductance is being monitored is not part of a resonant circuit and the frequency is not variable whilst the coil is in use. In general, the frequency of the applied a.c. waveform will be substantially fixed. Furthermore, the present invention advantageously permits the signal representing the measurement of inductance to be employed in the control of the position of a suspended object. This application is not envisaged in the prior art references.

The first coil may be an electromagnet coil in an apparatus for the electromagnetic control of the suspension of an object which apparatus includes, in addition to the electromagnet coil a source of electric power for the electromagnet coil which source includes a controllable electric supply device capable of delivering a controlled electric supply to the electromagnet coil, a control signal producer for producing an error control signal in response to an incremental change in a parameter related to the position of the object relative to the electromagnet and a negative feedback control loop for feeding an error control signal generated by the control signal producer to the electric supply device to adjust the electrical supply to the electromagnet coil so as to stabilise the suspension of the object relative to the electromagnet, wherein the control signal producer includes the means for monitoring the inductance of the coil.

The electromagnet coil, herein called the "control coil", may be provided on a magnetic core.

The object may be any of the objects of types known to be influenced by the magnetic field generated by a current-carrying coil, eg a magnetic material, a permanent magnet, an electromagnet or a current-carrying conductor.

The electric supply device may comprise a controlled power amplifier circuit connected to a fixed voltage source, thereby delivering a controlled direct current level to the control coil.

The amplifier of the amplifier circuit is preferably a high gain amplifier and may be an amplifier of any one of classes A, B, C, D and E. preferably, the gain of the amplifier is greater than 200, desirably greater than 500.

Where the second coil is itself in the resonant circuit the amplitude detector requires isolation from the d.c. components in the second coil and this may be provided by connecting the respective leads to the said amplitude detector through capacitors.

Where the second coil is employed together with a third coil as a transformer the a.c. signal injected through the second coil (or primary coil of the transformer) induces a voltage alternating at the same frequency to appear across the third coil (or secondary coil of the transformer). The induced voltage is a measure of the varying a.c. component of the current flowing through the control coil at the applied frequency.

The amplitude of the alternating voltage detected by the amplitude detector may be compared in an error detector with a reference signal comprising a desired mean level, and the error signal comprising variations between the measured amplitude and the desired mean level may be integrated by an integrator and thereafter employed as a control signal in a closed negative feedback loop (which may be in parallel with one or more other loops) connected to the aforementioned controllable electric supply device, eg power amplifier circuit, to adjust the electrical supply to the control coil to maintain the inductance (and impedance) of the control coil at a desired mean level.

The injected a.c. signal may be applied as an input to the circuit of the controllable electric supply device and thereby superimposed upon the nominally d.c. output of that device supplied to the control coil. Desirably, although not essentially, the resonant frequency is greater than the normal audio range and is preferably in the range 15 to 25 kHz, eg 20 kHz.

In any application where changes in the resistance of circuit resistors in apparatus embodying the invention may be caused by changes in temperature of the operating environment such resistors may be variable resistors each controlled to have a fixed resistance value over a range of operating temperatures.

It can be shown that the control of position of the object by measurement of the inductance of the control coil in the manner described provides so-called integral control of the suspension of the object which is a known desirable kind of control in which the relationship between the total force acting upon the object and the time integral of the incremental distance moved by the object is a relationship of positive slope.

The control signal producer and feedback loops may be used in conjunction with one or more arrangements comprising feedback loops to provide other forms of control of the suspension of the object by the control coil. For example, so-called proportional and/or derivative control of the suspension of the object may also be provided in the manner described in co-pending U.S. patent application Ser. No. 07/986,735 filed Dec. 8, 1992 by the present Assignees (the contents of which are incorporated herein by reference), wherein signals representative of the voltage component due to pure inductance across the coil and the current flowing through the coil are obtained and one is differentiated or integrated as appropriate and balanced against the other to derive an error control signal for use in the feedback loop. Such a method of control can provide independent proportional and derivative control of the object suspension in addition to the integral control which may be obtained by use of the present invention.

The present invention allows the problems associated with separate transducers as described hereinbefore to be avoided. Electromagnetic control of the suspension of an object may be achieved at higher temperatures which could otherwise harm the separate transducers as used in the prior art and greater electromagnetic control force per unit area may be obtained by use of the present invention. As the measurement system can be formed by using less discrete parts, suspension control may be achieved more cheaply and more reliably than with prior art systems.

In a particular form of the present invention the coil whose inductance is being monitored may be energised by a circuit in a Class D configuration to minimise power consumption. This will be called a "Class D" form of the invention. In this case the input drive signal, which may be that obtained from a negative feedback loop for control of position of a suspended object, is used to control the mark-space ratio of a square (or rectangular) waveform. This causes the fundamental frequency of the applied waveform to vary in a sinusoidal manner relative to the mark-space ratio. In order to compensate for this variation a further coil (called a fourth coil to distinguish from the aforementioned coils) providing a known impedance (as a function of frequency) may be connected in parallel with the first coil. The fourth coil is connected to a fifth coil in series with the fourth coil, and (as for the circuit of the first coil) a resonant circuit is formed by connection of a capacitor to the fifth coil or to a sixth coil which is in a mutually inductive relationship with the fifth coil so that the fifth and sixth coils act as the primary and secondary coils of a transformer. The waveform applied to the first coil is also applied to the fourth coil.

In the Class D form of the invention the signal S1 across the first mentioned or "first" resonant circuit component which is a measure of the a.c. component of the current flowing through the first coil varies with mark-space ratio of the input waveform and also with separation x between the electromagnet comprising the first coil and the object controlled thereby. The signal S2 across the further or "second" resonant circuit component which is a measure of the a.c. component of the current flowing through the fourth coil varies only with mark-space ratio of the input waveform. Information on the separation x may be obtained by dividing the signal S1 by the signal S2.

This division gives:

$$\frac{S1}{S2} = \frac{k_1 x \sin wt}{k_2 \sin wt}$$

where $k_1$ and $k_2$ are constants and w and t represent respectively angular frequency and time.

This can be re-written as:

$$\frac{S1}{S2} = k_3 x$$

where $k_3$ is a further constant.

Thus, a signal which is representative of the division of the amplitude of S1 by the amplitude of S2 may be employed as the input of the error detector as specified hereinbefore and the output employed for feedback loop control of the separation x in the manner as described above. The division may be carried out by applying the respective signals S1, S2 picked up from the first and second resonant circuits to amplitude detectors and then feeding into an operational amplifier the output of the amplitude detector for signal S2 together with the output of a multiplier whose inputs are the output of the amplitude detector for signal S1 and the output of the operational amplifier.

In the Class D form the first coil is contained in a circuit, comprising two drive transistors between which the first and second coils are connected, the fourth and fifth coils also being connected between the transistors in parallel with the first and second coils. The transistors may be connected between terminals having a positive and a negative potential, the connections including rectifying diodes. The term "transistors" here includes bipolar transistors of either the n-p-n or p-n-p type, or field effect transistors, or other semiconductor devices known to those skilled in the art to operate in a similar manner to such transistors.

Desirably, the fourth coil does not itself form part of a tuned circuit.

Desirably, the impedance of the fourth coil is similar to that of the first coil. A resistor or capacitor which does not form a parallel tuned circuit may alternatively be used in place of the fourth coil or used together with the fourth coil to provide the desired impedance.

The apparatus according to the present invention may comprise a plurality of control means for controlling together the suspension of an object by controlling its position in the manner described above, each such means comprising a control coil, an electric supply device, an error control signal producer and a feedback loop from the control signal producer to the supply device all as described hereinbefore.

For example, two coils controlled in that way working together as a pair are required to control the suspension of an object in one dimension. An active electromagnetic bearing for a rotating shaft constituting the object being suspended may comprise two pairs of electromagnet coils controlled in the manner described the members of each pair working together to control one dimensional suspension, the overall bearing providing two dimensional suspension.

A complete suspension system for a shaft may comprise two or more such active bearings acting radially upon the shaft and one active thrust bearing acting upon an end of the shaft.

Use of apparatus according to the present invention to suspend a rotating shaft advantageously allows the problem of the restriction on the choice of location of separate transducers caused by bending of the shaft in its free-free mode to be avoided.

Where a plurality of coils are employed each to provide electromagnets these may be wound on different portions of a common core in a known manner. The core may be shaped and laminated in known manner. For example, it may be a solid ring shape with the object at the axis of the ring. The ring shape may have projections facing toward the axis some or all of the projections carrying the control coils. The core may be one of the other shapes well known in this field.

In apparatus according to the present invention comprising two electromagnetic control coils each having a feedback loop controlling a parameter relating to the position of the object, the control signal producer for producing an error control signal for each loop may comprise a single circuit common to the feedback loops associated with both coils. The control signal producer may have an output which is applied as a negative signal to the electric supply device of one control coil and as a positive signal to the electric supply device of the other control coil and vice versa (as appropriate). The output from the common circuit for each feedback loop may be applied in conjunction with an error control signal from a control signal producer dedicated to the control coil with which it is associated.

Active bearings embodying the present invention may be employed in any applications requiring contactless, maintenance-free, non-lubricated bearings. Such applications include bearings for moving parts in machines handling dangerous materials, eg radioactive, toxic or biologically active materials, high speed bearings for vacuum pumps, food processing (where lubrications would cause contamination), bearings for high temperature environments and bearings for low temperature environments (where oil and other lubricants would freeze).

Embodiments of the present invention will now be described by way of example with reference to the accompanying drawings, in which:

DESCRIPTION OF THE PREFERRED EMBODIMENTS

Figure 1:
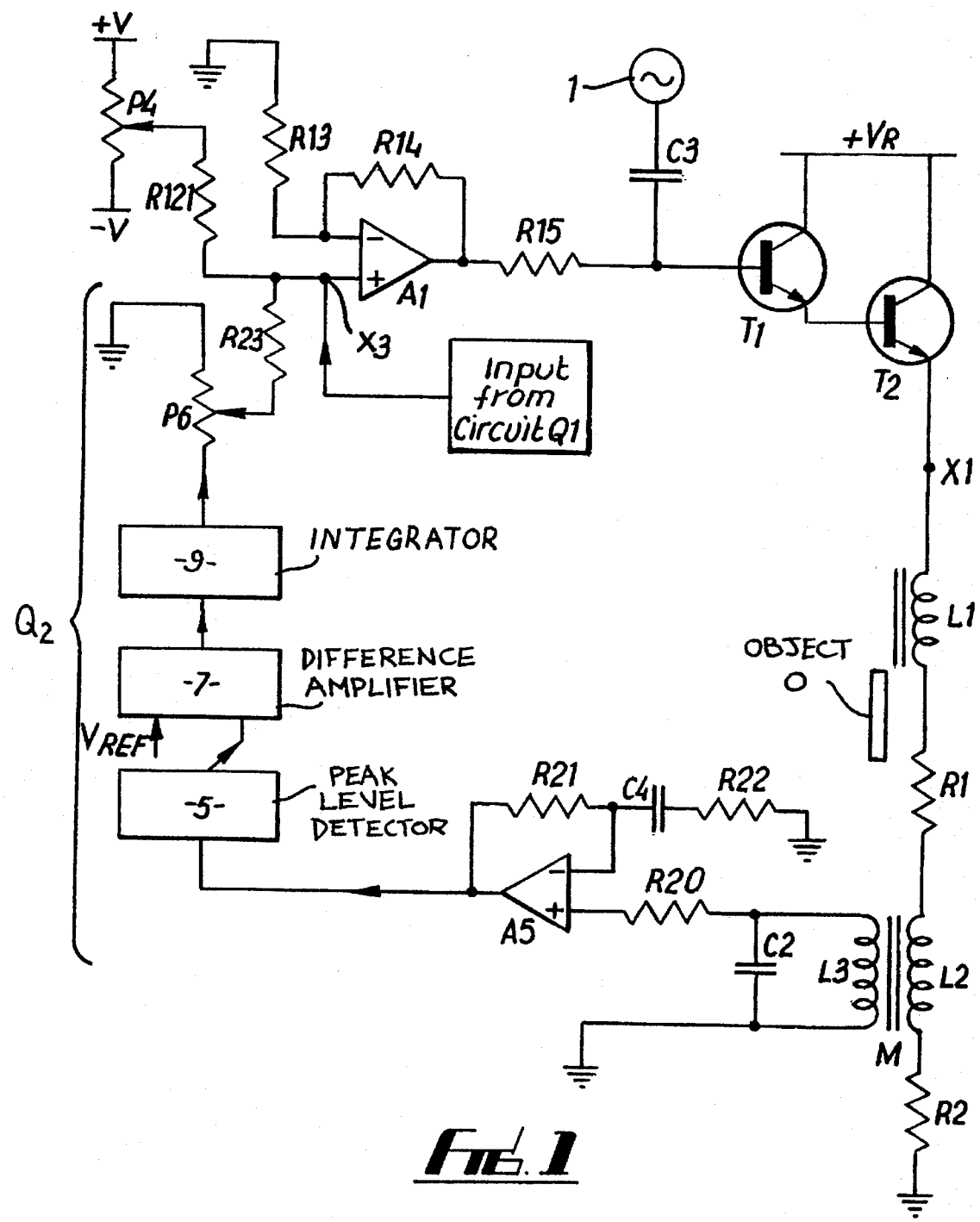
FIG. 1 is a circuit diagram of a feedback loop circuit embodying the present invention.

In FIG. 1 an electromagnet comprising a control coil represented by its inductance L1 and its resistance R1 is supplied at one of its terminals X1 with a nominally fixed level nominally d.c. supply by a high gain amplifier A1 driving through a resistor R15 a Darlington pair of transistors T1 and T2 connected to a supply voltage $+V_R$.

Superimposed upon the nominally d.c. output of the amplifier A1 is a 20 kHz a.c. signal provided by an oscillator 1 connected to the base of the transistor T1 through a capacitor C3. The output of the oscillator 1 and capacitor C3 could alternatively be applied as an input to the amplifier A1. The voltage applied to the control coil comprising L1 and R1 contains therefore a 20 kHz component of constant voltage amplitude. The impedance of the control coil varies with the air gap or separation between the electromagnet comprising the control coil and object being controlled O, and incremental changes in the air gap or separation caused by incremental changes in the total force upon the suspended object result in a varying 20 kHz current component passing through the control coil. An air core transformer M comprises a further or primary coil having an inductance L2 (and an internal resistance not shown) in series with the inductance L1 and resistance R1 and connected to ground through resistor R2, and a secondary coil having an inductance L3 connected in an output circuit to a capacitor C2. The components of the output circuit are chosen so that the circuit is resonant at the frequency of the oscillator 1. The resonant output circuit picks up by mutual induction in the secondary coil of inductance L3 a voltage related only to the 20 kHz component of current flowing through the control and primary coils of inductance L1 and L2. Because the amplitude of the applied alternating voltage component is constant, the induced voltage represents a measurement at the applied frequency of the impedance of the control coil and hence any change in the measured induced voltage can be detected to provide control of the gap between the electromagnet comprising the control coil and controlled object.

The amplitude of the 20 kHz component of voltage across the capacitor C2 is detected as follows. The voltage is applied via a resistor R20 providing a high input impedance to one input terminal of an amplifier A5 whose other terminal is connected via an isolating capacitor C4 through a resistor R22 to earth. A resistor R21 is also connected between the output of the amplifier A5 and the input to the amplifier A5 connected to the capacitor C4. The circuit comprising the amplifier A5 acts as a buffer to isolate its output from its input. The peak amplitude at the output of the amplifier A5 is detected by a peak level detector 5 and the detected peak level is compared with a reference voltage $V_{REF}$ in an error detector or difference amplifier 7, the difference being provided as an output. The output signal from the error detector 7 comprising an error signal is integrated by an integrator 9 whose output ramps until the error signal is zero, and the output of the integrator 9 is applied via a potentiometer P6 and a resistor R23 to the amplifier A1 at an input terminal X3 thereof thereby completing a feedback loop the amplifier A1. The other input terminal of the amplifier A1 is connected to earth through a resistor R13. The input terminal X3 to the amplifier A1 is also connected through a resistor R121 to the variable contact of a potentiometer P4, the positive end of which is at a positive potential +V and the negative end of which is at a negative potential −V. A resistor R14 is connected between the input to the amplifier A1 from the resistor R13 and the output of the amplifier A1.

When the control coil experiences an incremental increase in impedance indicating an incremental decrease in the gap from the electromagnet comprising the control coil to the suspended object the control signal applied from the integrator 9 at the terminal X3 is negative so as to increase the gap to its desired mean level to maintain the stable position of the object. Likewise, when the impedance falls a positive control signal is applied at the terminal X3 causing the gap to be reduced. The level of the reference voltage $V_{REF}$ is selected so as to define the required mean stable gap between the electromagnet and controlled object.

The feedback loop from the transformer M to the input terminal X3 will hereinafter be referred to as "Circuit Q2". Control of the suspension of the object by the arrangement comprising the Circuit Q2, as noted above, can be shown to be so-called integral control. So-called proportional and/or derivative control of the suspension of the object may also be achieved, eg by an arrangement as described in the aforementioned copending United States applications and the feedback loop employed in such an arrangement will herein be referred to as "Circuit Q1". The Circuits Q1 and Q2 may therefore be in parallel, each generating an error control signal. The error control signals generated by the Circuits Q1 and Q2 may be applied together at the terminal X3 as common inputs to the amplifier A1.

Figure 2:
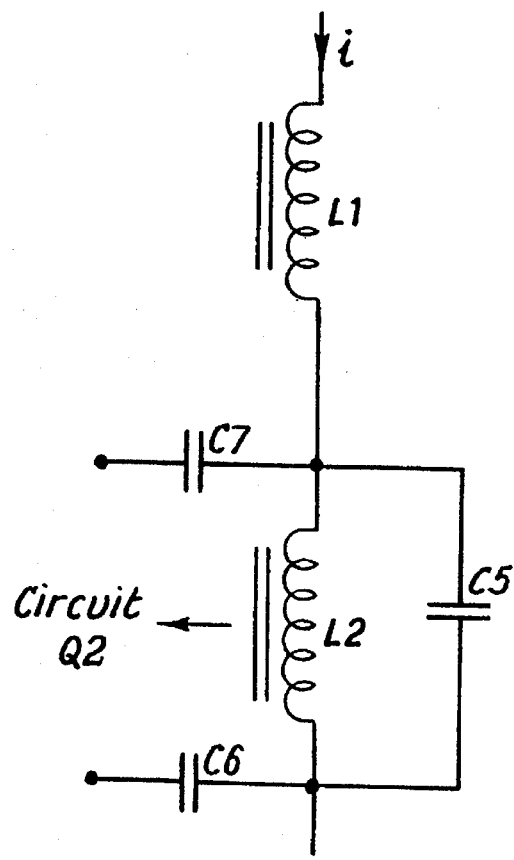
FIGS. 2 and 3 are circuit diagrams of alternative arrangements for the circuit shown in FIG. 1.
Figure 3:
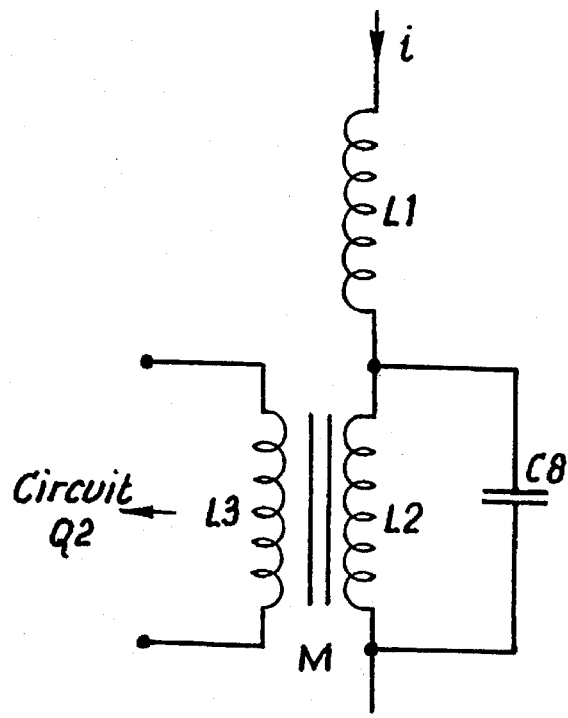

FIGS. 2 and 3 show alternative ways of deriving the input voltage to the amplifier A5 via resistor R20 in FIG. 1.

In FIG. 2 the second coil represented by L2 (connected in series with L1) is not part of a transformer but is itself connected to a capacitor C5 selected to give a resonant circuit with the coil L2. The voltage across the terminals of coil L2 is isolated via isolating capacitors C6, C7 and forms the input to Circuit Q2 via resistor R20 and amplifier A5 in the manner shown in FIG. 1.

In FIG. 2 and also in FIGS. 3 and 4 which are referred to as follows the internal resistance of the coils is not shown.

In FIG. 3 the second coil represented by L2 (connected in series with L1) is again the primary coil of a transformer M together with a secondary coil represented by L3 but in this case the capacitor, here C8, required for the resonant circuit is connected across the primary coil L2. The voltage across the terminals of coil L3 forms the input to Circuit Q2 via resistor R20 and amplifier A5 in the manner shown in FIG. 1.

Figure 4:
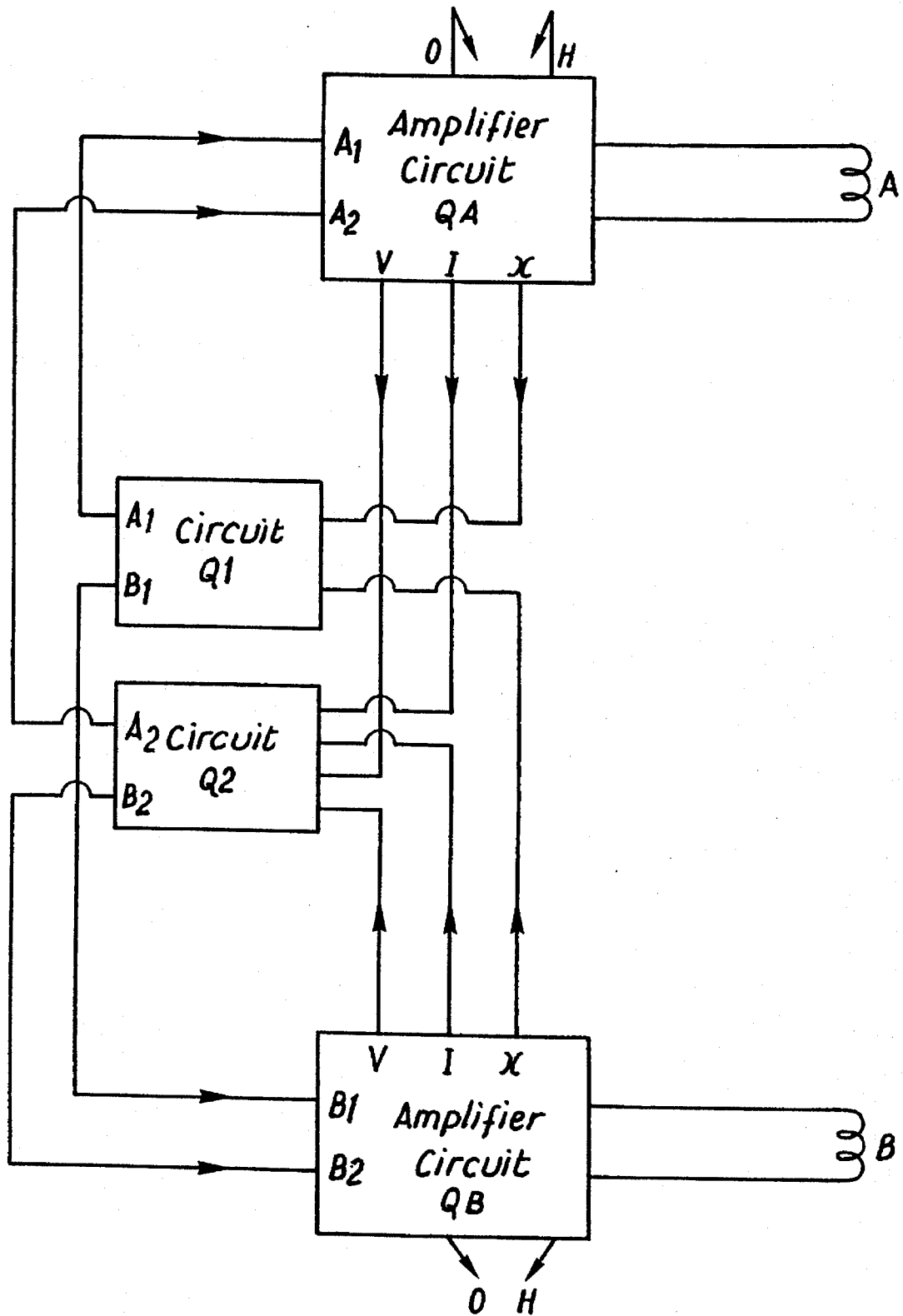
FIG. 4 is a block circuit diagram of apparatus embodying the present invention including two active electromagnet coils for controlling the suspension of an object.

FIG. 4 shows an example of how Circuits Q1 and Q2 may be combined and employed to influence two control coils A, B. The control coils may be incorporated in electromagnets which together form a pair, for example mutually controlling in an active bearing the position in one dimension of the axis of a rotating steel shaft (not shown). In practice there would be a known geometrical arrangement of the coils and the object being controlled to optimise this form of operation. In FIG. 4, the amplifier A1 (and its associated input resistances and reference voltage), the transistors T1 and T2, the capacitor C3 and the connections from the first control coil, in this case coil A, to the Circuits Q1 and Q2 are all embodied within an amplifier circuit QA providing input current to the coil A. Likewise, a similar arrangement of components is embodied within an amplifier circuit QB providing input current to the second control coil, in this case coil B. Variations in the voltage across each coil A, B, indicated in FIG. 4 as V and, variations in the current through each coil A, B, indicated as I, are detected respectively by the Circuit Q1 operating jointly upon the two pairs of inputs. Variations in the impedance of each coil A, B indicated in FIG. 4 as x (because impedance is measured to control the gap x from the electromagnet to the controlled object) are detected respectively by the Circuit Q2 as described above operating jointly on the two inputs. An error control signal (for use in proportional and/or derivative control as in the copending UK patent Applications) is generated by the Circuit Q1 with the additional feature, provided by a logic unit (not shown) within Q1 applied to the output of Q1, that where the output to be applied to the amplifier circuit QA is positive the same error control signal but with a negative sign is applied to the amplifier circuit QB, and vice versa. Likewise, an error control signal for use in integral control is generated by the Circuit Q2 in the manner described above with reference to FIG. 1, again with the additional feature that this signal is applied both to the amplifier circuit QA and the amplifier circuit QB except that the sense of the signal applied to QA is positive when that applied to QB is negative and vice versa. The error control signal outputs of the circuit Q1 shown respectively as A1 and B1 in FIG. 4 are equal and of opposite sense, as applied to the respective amplifiers of the amplifier circuits QA, QB, so that the incremental changes required to the input current and voltage applied to the respective coils A, B to provide proportional and/or derivative control of the suspended object are equal and opposite. The control signal outputs of the circuit Q2 shown respectively as A2 and B2 are equal and of opposite sense, as applied to the respective amplifiers of the amplifier circuits QA, QB so that the incremental electric supply changes required to the respective coils A, B to give integral control by stabilising the gap between the electromagnet and the controlled object at a selected mean, are equal and opposite.

In FIG. 4, two input connections H and O are shown to the Circuits QA and QB and represent connections respectively to a high current supply and oscillator. These are equivalent to the input from voltage source $V_R$ and a.c. from the oscillator 1 in FIG. 3.

Figure 5:
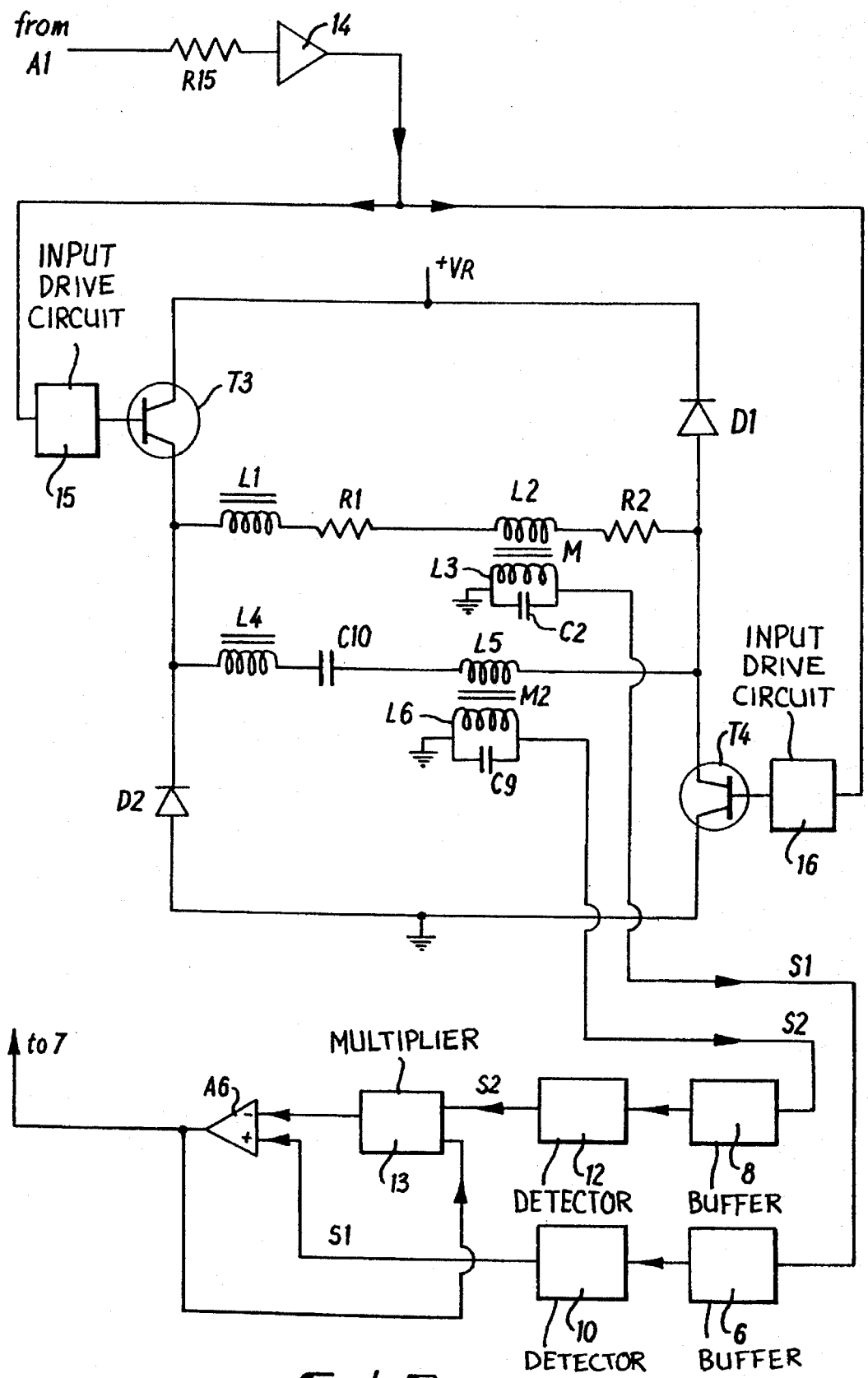
FIG. 5 is a circuit diagram of an alternative form of circuit embodying the present invention.

FIG. 5 shows a circuit embodying the present invention which is a form of circuit alternative to that shown in FIG. 1. Items which are the same as in FIG. 1 have the same reference numerals. In FIG. 5, the control coil represented by L1 and R1 is energised in a Class D configuration. The coil L2 and resistor R2 are again connected in series with the coil represented by L1 and R1 and all are connected between one output terminal of a transistor T3 and one output terminal of a transistor T4. The transistors T3 and T4 may be p-n-p or n-p-n bipolar transistors, so the output terminals may be the collectors or emitters or one of each. Alternatively, the transistors T3 and T4 may be replaced by field effect transistors or other semi-conductor devices known by those skilled in the art to be suitable for use in such circuits.

A further coil L4, a capacitor C10 and a coil L5 all in series are similarly connected between the two transistors T3 and T4 to form a circuit in parallel with that containing L1. The remaining output terminal of the transistor T3 is connected to a constant supply voltage $+V_R$ and the remaining output terminal of the transistor T4 is connected to earth. A diode D1 is connected between the voltage $+V_R$ and the output terminal of the transistor T4 connected to the coil L5. A diode D2 is connected between earth and the output terminal of the transistor T3 connected to the control coil represented by L1.

The coil L2 is again the primary of the air core transformer M having the secondary coil L3 connected in a first resonant circuit with the capacitor C2. In a similar manner the coil L5 is the primary of an air core transformer M2 having its secondary coil L6 connected in a second resonant circuit with a capacitor C9.

The inputs to the bases of each of the transistors T3 and T4, applied via base input drive circuits 15, 16 respectively, comprise a Class D waveform derived from a mark-space generator 14 which has as its input the output of amplifier A1 (FIG. 1). The result of this is that a square waveform of voltage of nominally constant amplitude but variable mark-space ratio is applied across the parallel circuits containing L1 and L4.

The signals S1 and S2 as referred to hereinbefore are picked up by connections respectively to (a) the first resonant circuit containing the coil L3 and capacitor C2 and (b) the second resonant circuit containing the coil L6 and capacitor C9. The signals S1 and S2 are passed through buffers 6, 8 and their amplitudes are then sensed in amplitude detectors 10, 12 respectively. The output of the detector 10, S1, is divided by the output of the detector 12, S2 in the following way. The signal S2 is applied as an input to a multiplier 13 whose output is applied to an operational amplifier A6 the other input to the operational amplifier A6 being the signal S1. The output of the amplifier A6 is returned as the second input to the multiplier 13.

The output of amplifier A6 representing the result of division of S1 by S2 is fed to the difference amplifier 7 as in FIG. 1 and is thereafter processed in a feedback loop to the amplifier A1 (FIG. 1) the remainder of the loop to amplifier A1 being as in FIG. 1.

We claim:

1. An apparatus for monitoring the inductance of a first coil which is not part of a resonant circuit including:

a second coil connected in series with the first coil;

a resonant circuit which is formed by connection of a capacitor to the second coil;

means for injecting into the circuit containing the first and second coils an a.c. signal of substantially constant peak voltage amplitude having a frequency within the resonance peak of the resonant circuit; and an amplitude detector for measuring the amplitude of the voltage across a component of the resonant circuit.

2. Apparatus as in claim 1 wherein the said second coil is itself in the resonant circuit and the said amplitude detector is provided with isolation from the second coil by capacitors between the said resonant circuit and the amplitude detector.

3. Apparatus as in claim 1 and wherein the said second coil is employed together with a third coil as a transformer, whereby in operation the a.c. signal injected through the second coil, or primary coil of the transformer induces a voltage alternating at the same frequency to appear across the third coil.

4. Apparatus as in claim 1 and wherein the first coil is a control coil of an electromagnet for the electromagnetic control of suspension of an object, which apparatus further includes a source of electric power for the control coil which source includes a controllable electric supply device capable of delivering a controlled electrical supply to the control coil, a control signal producer for producing an error control signal in response to an incremental change in a parameter related to the position of the object relative to electromagnet and a negative feedback control loop for feeding said error control signal generated by the control signal producer to the electric supply device to adjust the electrical supply to the control coil so as to stabilize the suspension of the object relative to the electromagnet by integral control of the position of the object, wherein said control signal producer includes said means for monitoring the inductance of the control coil.

5. Apparatus as in claim 4 and wherein the control coil of the electromagnet is provided on a magnetic core.

6. Apparatus as in claim 4 and including the said object which is an object of a type known to be influenced by a magnetic field generated by a current-carrying coil, and is selected from a magnetic material, a permanent magnet, an electromagnet and a current-carrying conductor.

7. Apparatus as in claim 4 and wherein the electric supply device comprises a controlled power amplifier circuit connected to a fixed voltage source, thereby delivering a controlled direct current to the control coil.

8. Apparatus as in claim 4 and wherein the first coil is contained in a circuit having a Class D operational configuration, the circuit comprising two drive transistors between which the first and second coils are connected, the circuit also comprising an impedance in series with a further coil, said impedance and said further coil being connected between said transistors in parallel with the first and second coils, said further coil connected in a further resonant circuit whose resonance peak in operation includes said frequency of the a.c. signal injected by the injection means and means for measuring the voltage across a component of the further resonant circuit.

9. Apparatus as in claim 8 and including means for dividing a signal representing the amplitude of the voltage across a component of the first mentioned resonant circuit by a signal representing the amplitude of the voltage across a component of the said further resonant circuit.

10. Apparatus as in claim 9 and wherein the means for dividing comprises a multiplier to which the signal is applied as a first input and whose output is connected to form a first input to an operational amplifier the signal being applied in operation as the other input to the operational amplifier, the output of the operational amplifier also being applied to form the other input to the multiplier.

11. Apparatus as in claim 9 and wherein the signal representing the voltage across a component of the first mentioned resonant circuit is applied to a first amplitude detector and the signal representing the voltage across a component of the further resonant circuit is applied to a second amplitude detector and wherein the result of the division of the signal by the signal is compared in an error detector with a reference signal comprising a desired mean level, and the error signal comprising variations between the measured division of by and the desired mean level is integrated in an integrator and thereafter employed as a control signal in a closed negative feedback loop connected to said controllable electric supply device to adjust the electrical supply to the control coil to maintain the inductance at a desired mean level.

12. Apparatus as in claim 8 and wherein the said transistors are connected between terminals having a positive and a negative potential by rectifying diodes.

13. Apparatus as in claim 8 wherein said further coil comprises a primary coil of a transformer, said transformer including a secondary coil, said secondary coil connected in parallel with a capacitor to form said further resonant circuit.

14. Apparatus as in claim 4 and wherein the amplitude of the alternating voltage detected by the said amplitude detector is compared in an error detector with a reference signal comprising a desired mean level, and the error signal comprising variations between the measured amplitude and the desired mean level is integrated in an integrator and thereafter employed as a control signal in a closed negative feedback loop connected to said controllable electric supply device to adjust the electrical supply to the control coil to maintain the inductance at a desired mean level.

15. Apparatus as in claim 4 and wherein the said control signal producer and feedback loop are applied in conjunction with one or more other feedback loops to provide other forms of control, in addition to integral control of position, related to the suspension of the object by the coil.

16. Apparatus as in claim 14 and comprising two electromagnet control coils each having a feedback loop controlling the position of the object, the control signal producer for producing an error control signal for each loop comprising a single circuit common to the feedback loops associated with both coils, the control signal producer having an output which is applied as a negative signal to the electric supply device of one control coil and as a positive signal to the electric supply device of the other control coil and vice versa as appropriate.

17. Apparatus as in claim 16 and wherein the output from the common circuit for each feedback loop is applied in conjunction with the error control signal from the control signal producer dedicated to the control coil with which it is associated.

18. Apparatus as in claim 4 and wherein the first coil is contained in a circuit having a Class D operational configuration, the circuit comprising two drive transistors between which the first and second coils are connected, said first and second coils having a first impedance, the circuit also comprising a further second impedance in series with a further coil, said second impedance and said further coil connected between said transistors in parallel with the first and second coils, on additional impedance in a mutually inductive relationship with said second coil and comprising a further resonant circuit whose resonance peak in operation includes said frequency of the a.c. signal injected by the injection means and means for measuring the voltage across a component of the further resonant circuit.

19. Apparatus as in claim 1 and wherein in operation the said injected a.c. signal is applied as an input to the circuit of a controllable electric supply device and thereby superimposed upon a nominally d.c. output of that device supplied to the first coil, said resonant frequency being in the range 15 to 25 kHz.

20. An apparatus for monitoring the inductance of a first coil which is not part of a resonant circuit including:

- a second coil connected in series with the first coil;
- a resonant circuit which is formed by connection of a capacitor to a third coil which is in a mutually inductive relationship with the second coil so that the second and third coils act as the primary and secondary coils of a transformer;
- means for injecting into the circuit containing the first and second coils an a.c. signal of substantially constant peak voltage amplitude having a frequency within the resonance peak of the resonant circuit; and
- an amplitude detector for measuring the amplitude of the voltage across a component of the resonant circuit.

* * * * *